(12) United States Patent
Weber

(10) Patent No.: US 6,908,844 B2
(45) Date of Patent: Jun. 21, 2005

(54) METALLIZATION ARRANGEMENT FOR SEMICONDUCTOR STRUCTURE AND CORRESPONDING FABRICATION METHOD

(75) Inventor: Detlef Weber, Grünberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,909

(22) Filed: Jul. 3, 2001

(65) Prior Publication Data

US 2002/0030278 A1 Mar. 14, 2002

(30) Foreign Application Priority Data

Jul. 7, 2000 (DE) .......................................... 100 34 020

(51) Int. Cl.⁷ .......................................... H01L 21/4763
(52) U.S. Cl. ........................ 438/622; 438/623; 438/624
(58) Field of Search ................................ 438/622, 623, 438/624; 257/758, 773, 760

(56) References Cited

U.S. PATENT DOCUMENTS

| | | | |
|---|---|---|---|
| 5,391,921 A | | 2/1995 | Kudoh et al. |
| 5,573,973 A | * | 11/1996 | Sethi et al. ................. 438/386 |
| 5,744,865 A | * | 4/1998 | Jeng et al. ................... 257/750 |
| 5,793,110 A | * | 8/1998 | Yamaha et al. ............. 257/750 |
| 5,886,410 A | * | 3/1999 | Chiang et al. .............. 257/759 |
| 6,268,279 B1 | | 7/2001 | Okada |
| 6,498,398 B1 | * | 12/2002 | Usami ......................... 257/760 |
| 6,627,539 B1 | * | 9/2003 | Zhao et al. .................. 438/638 |

FOREIGN PATENT DOCUMENTS

| | | | |
|---|---|---|---|
| EP | 0 550 910 A1 | 7/1993 | |
| EP | 0 989 609 A1 | 3/2000 | ......... H01L/23/522 |

OTHER PUBLICATIONS

Patent Abstracts of Japan, vol. 2000, No. 3, corresponding to JP 11 345875, (1999).
Patent Abstracts of Japan, vol. 2000, No. 4, corresponding to JP 2000 031144, (2000).
Patent Abstracts of Japan, vol. 1996, No. 10, corresponding JP 08 148556, (1996).
Rossnagel, S.M., "Filling dual damascene interconnect structures with AlCu and Cu using ionized magnetron deposition", *J.Vac. Sci. Technol.* B 13:125–129, (1995).

* cited by examiner

*Primary Examiner*—Phat X. Cao
(74) *Attorney, Agent, or Firm*—Fish & Richardson P.C.

(57) ABSTRACT

The present invention provides a metallization arrangement for a semiconductor structure (1) having a first substructure plane (M1), preferably a first metallization plane; a second metallization plane (M2) having a first and a second adjacent interconnect (LBA; LBB); a first intermediate dielectric (ILD1) for mutual electrical insulation of the first substructure plane (M1) and second metallization plane (M2); and via holes (V) filled with a conductive material (FM) in the intermediate dielectric (ILD1) for connecting the first substructure plane (M1) and second metallization plane (M2). A liner layer (L) made of a dielectric material is provided under the second metallization plane (M2), which liner layer is interrupted in the interspace (O) between the first and second adjacent interconnects (LBA; LBB) of the second metallization plane (M2). The invention likewise provides a corresponding fabrication method.

7 Claims, 3 Drawing Sheets

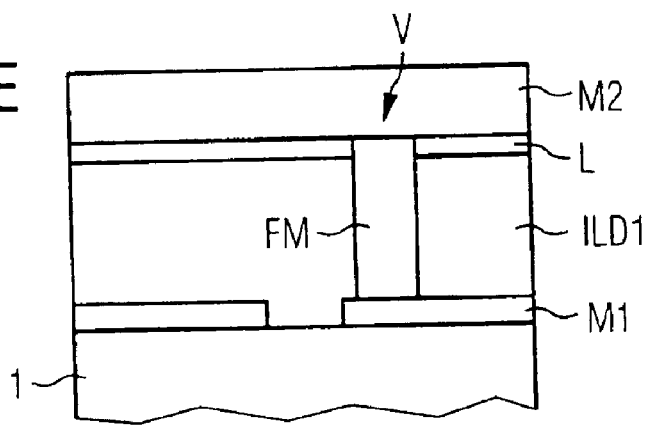
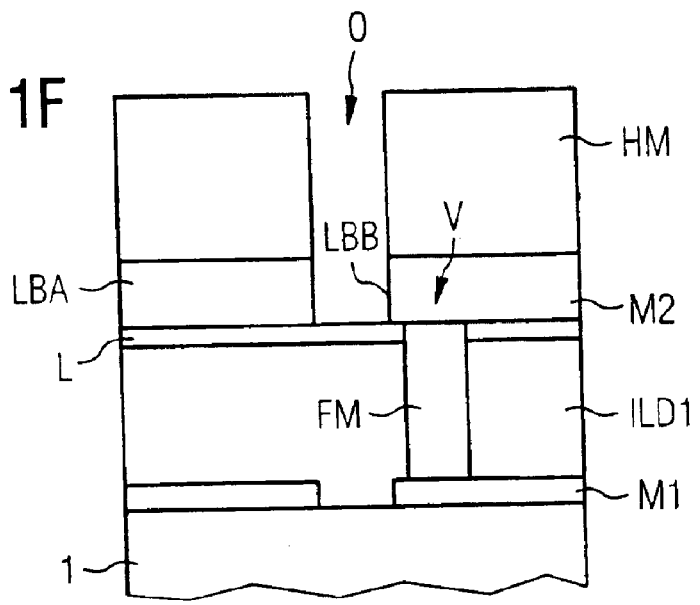
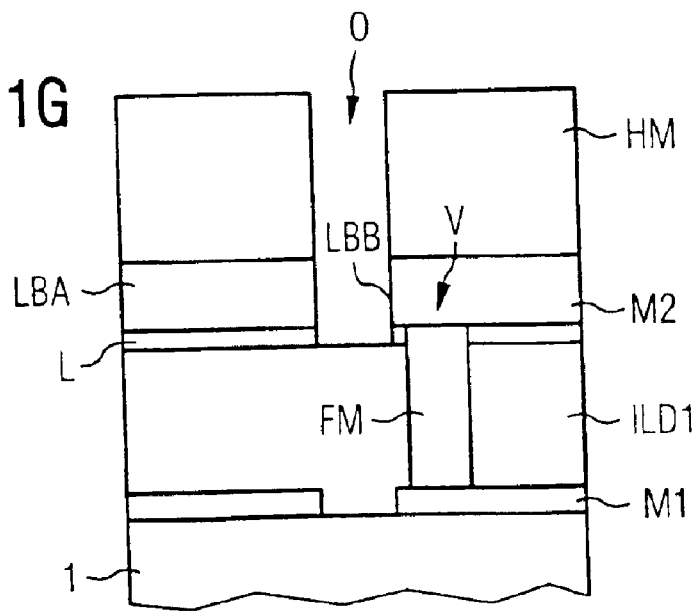

METALLIZATION ARRANGEMENT FOR SEMICONDUCTOR STRUCTURE AND CORRESPONDING FABRICATION METHOD

BACKGROUND

The present invention relates to a metallization arrangement for a semiconductor structure having a first substructure plane; a second metallization plane having a first and a second adjacent interconnect; a first intermediate dielectric for mutual electrical insulation of the first substructure plane and second metallization lane; and via holes filled with a conductive material in the first intermediate dielectric for connecting the first substructure plane and second metallization plane. The invention likewise relates to a corresponding fabrication method.

The term semiconductor structure is to be understood in the general sense and can therefore encompass both single-layered and multilayered structures with any desired semiconductor components. By way of example, the semiconductor structure is an integrated circuit for which the metallization arrangement provides internal or external wiring.

FIG. 2 shows a diagrammatic illustration of a known metallization arrangement for a semiconductor structure.

In FIG. 2, 1 designates a semiconductor structure, for example an electrical circuit integrated in a silicon substrate, L1 designates a first liner layer made of silicon dioxide, M1 designates a first metallization plane, ILD designates an intermediate dielectric, V designates a via hole filled with a conductive material FM, L2 designates a second liner layer, M2 designates a second metallization layer, LBA designates a first interconnect, LBB designates a second interconnect and O designates an interspace between the first and second interconnects LBA, LBB, and K designates critical locations of the structure.

In general, the aim of introducing the intermediate dielectric ILD having a low dielectric constant is to reduce the capacitive coupling of adjacent interconnects and thus improve the functional efficiency with the chip are unchanged. However, integrating the intermediate dielectric ILD having a low dielectric constant generally requires the provision of the liner layer L1 or L2, for example in the form of a silicon oxide liner or silicon nitride liner, for patterning the via holes V and as diffusion barrier (e.g. in the case of ALCu metallization).

The relatively high dielectric constant of such a liner layer L1 or L2 in the form of a silicon oxide liner or silicon nitride liner has an adverse effect, however, on the capacitive coupling of adjacent interconnects, for example LBA and LBB. Such critical locations in the known arrangement in accordance with FIG. 2 are designated by K.

SUMMARY

The present invention is based on the object of reducing the disturbing capacitive coupling.

According to the present invention, it is possible to considerably reduce disturbing capacitive coupling between adjacent interconnects of the second metallization plane.

The general idea underlying the present invention is that a liner layer made of a dielectric material is provided under the second metallization plane, which liner layer is interrupted in the interspace between the first and second adjacent interconnects of the second metallization plane.

In accordance with a preferred development, the first substructure plane is a first metallization plane.

In accordance with a further preferred development, the interspace between the first and second adjacent interconnects of the second metallization plane is filled with a second intermediate dielectric above the first intermediate dielectric. Thus, it is possible for a plurality of metallization layers with intervening dielectrics to be stacked one above the other.

In accordance with a further preferred development, the semiconductor structure has an electrical circuit integrated in a silicon substrate.

In accordance with a further preferred development, the liner layer is fabricated from silicon dioxide or silicon nitride.

In accordance with a further preferred development, the first and/or second metallization plane are/is fabricated from ALCu.

In accordance with a further preferred development, the patterning and interrupting are carried out in a common etching step. This requires merely the selection of a suitable etchant and/or of a suitable liner/metal combination. In comparison with the customary process, there is then merely a need for a longer etching time, but not for an additional mask plane or an additional etching step.

In accordance with a further preferred development, the patterning is carried out in a first metal etching step and the interrupting is carried out in a second silicon dioxide etching step.

In accordance with a further preferred development, a hard mask or a resist mask, which is provided on the second metallization plane, is used for the patterning and interrupting processes.

An exemplary embodiment of the invention is illustrated in the drawings and explained in more detail in the description below.

BRIEF DESCRIPTION OF THE FIGURES

FIGS. 1a–h show a diagrammatic illustration of the essential method steps for fabricating a metallization arrangement for a semiconductor structure as embodiment of the present invention.

In the figures, identical reference symbols designate identical or functionally identical elements.

DETAILED DESCRIPTION

FIGS. 1a–h show a diagrammatic illustration of the essential method steps for fabricating a metallization arrangement for a semiconductor structure as embodiment of the present invention.

Figure 1A:
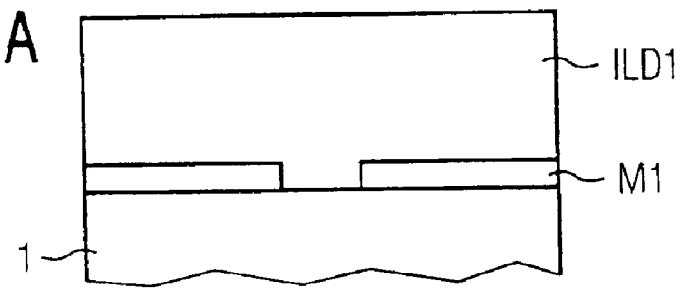

As illustrated in FIG. 1a, first of all the first metallization layer M1 is deposited on the semiconductor structure 1 and patterned. Afterward, an intermediate dielectric ILD1 is deposited over the whole area on the resulting structure. This intermediate dielectric ILD1 having a low dielectric constant is a carbon-containing $SiO_2$ layer, for example.

Figure 1B:
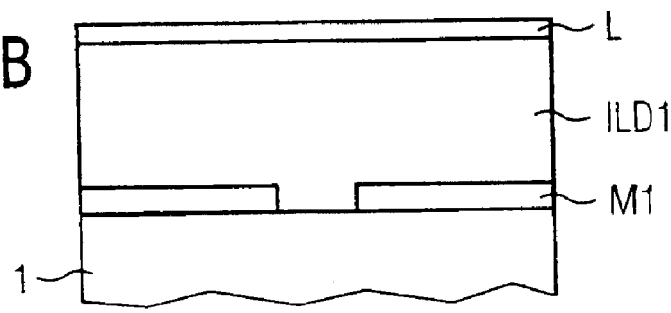

According to FIG. 1b, in a following process step, a liner layer L is applied to the resulting structure. In this respect, it should be noted that the dielectric constant of the liner layer L is greater than the dielectric constant of the intermediate dielectric ILD1.

Figure 1C:
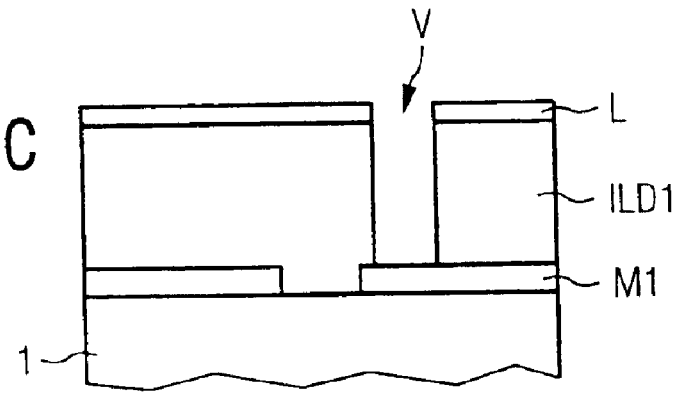

The liner layer L and the intermediate dielectric ILD1 are then patterned by means of a standard photolithographic technique. This creates the via hole V, as illustrated in FIG. 1c.

Figure 1D:
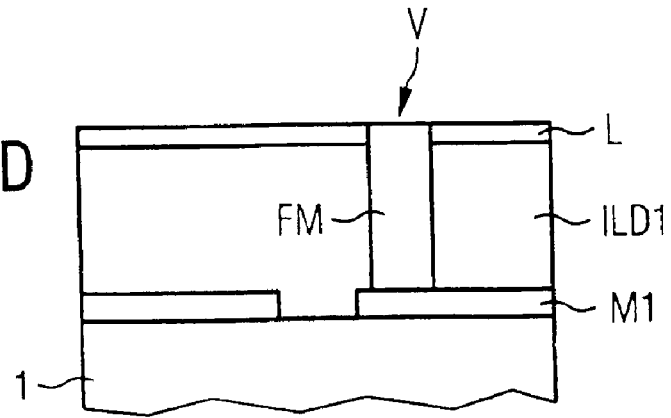

In a further process step, as illustrated in FIG. 1d, the via hole V is then filled with the conductive filling material FM.

Afterward, or in the same process step, a second metallization layer M2 is then deposited, which leads to the structure shown in FIG. 1e.

A photoresist mask or, as in the present example, a hard mask made of silicon nitride, for example, is subsequently provided on the second metallization layer M2. Using the hard mask HM, the second metallization layer M2 is patterned into the interconnects LBA and LBB. This is illustrated in FIG. 1f.

Either in the same etching step or in an additional etching step using a different etching medium, the uncovered liner layer L is then etched away, with the result that the interspace O no longer contains any liner nor any metal. This is illustrated in FIG. 1g.

Consequently, the metal structure transferred to the liner layer L made of silicon dioxide. Given suitable selection of the liner layer 6 and of the etching medium, this merely requires prolonging the known etching process for the metallization layer M2.

Figure 1H:
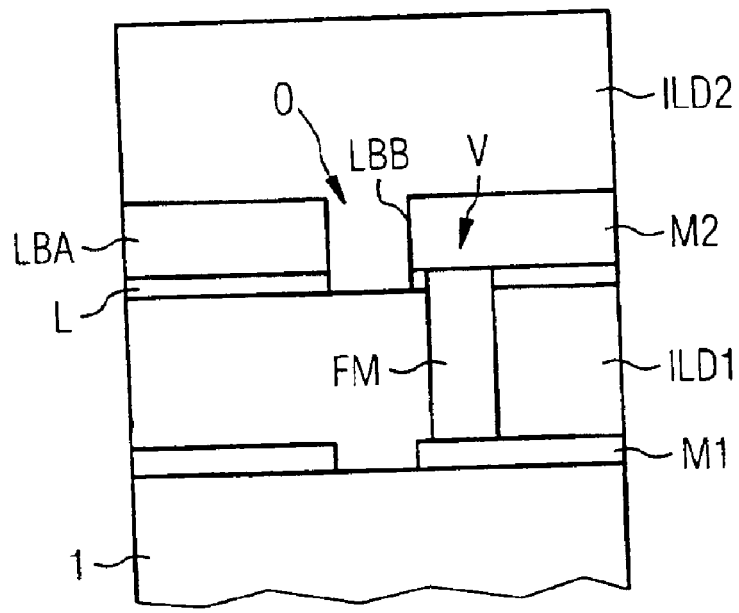
Figure 2:
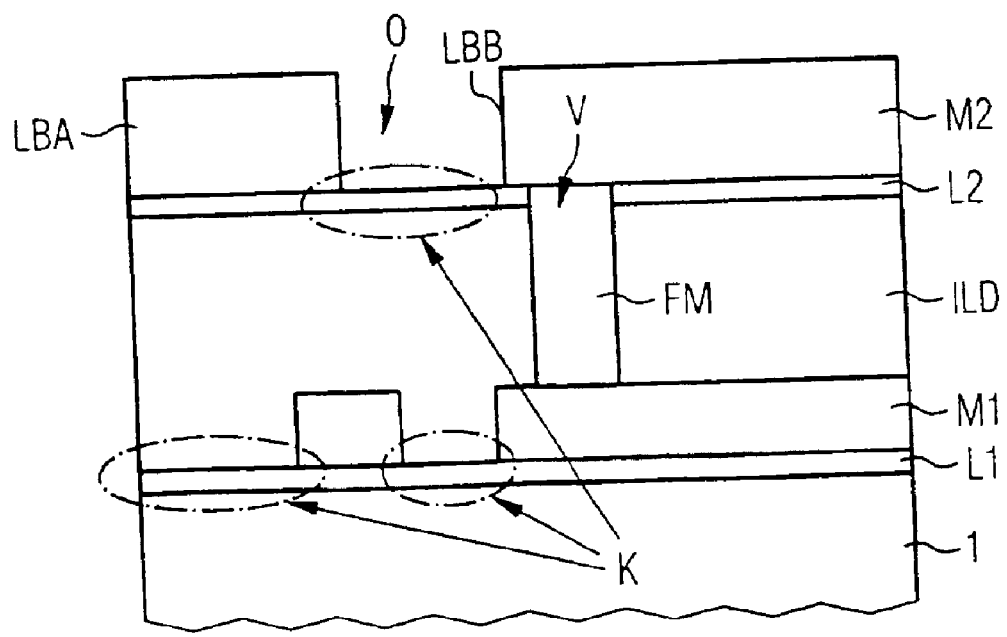
FIG. 2 shows a diagrammatic illustration of a known metallization arrangement of a semiconductor structure.

In accordance with the structure illustrated in FIG. 1h, the hard mask HM is then removed and a further intermediate dielectric layer ILD2 is deposited. Either a concluding passivation layer or a further third metallization layer, etc, can then be applied on said further intermediate dielectric ILD2.

As can clearly be seen from FIG. 1h, this type of process control results in the liner layer L made of silicon dioxide being removed wherever the metal layer M2 is also removed, with the result that the disturbing capacitive coupling effects are eliminated.

Although the present invention has been described above using a preferred exemplary embodiment, it is not restricted thereto but rather can be modified in diverse ways.

It goes without saying that the present invention can be applied to any desired semiconductor structures, in particular integrated circuits, and any desired basic semiconductor materials; in particular, it is possible to use any desired semiconductor materials or material sandwiches as substrates.

Although the first substructure plane is a metallization plane in the above example, it can also be a different plane, that is to say the invention can be applied to the bottommost metallization plane.

What is claimed is:

1. A method for fabricating a metallization arrangement for a semiconductor structure, said method comprising:
    providing a first metallization plane on said semiconductor structure;
    providing a first intermediate dielectric on said first metallization plane, said first intermediate dielectric having a first dielectric constant;
    providing a liner layer made of a dielectric material on said first intermediate dielectric, said liner having a second dielectric constant that is greater than the first dielectric constant;
    providing via holes in said first intermediate dielectric and said liner layer, said via holes being filled with a conductive material, thereby completing a first resulting structure;
    providing a second metallization plane on said first resulting structure, said liner layer acting as a diffusion barrier for the second metallization plane;
    patterning first and second interconnects in said second metallization plane thereby forming an interspace between said first and second interconnects; and
    completely interrupting said liner layer in said interspace between said first interconnect and said second interconnect such that said liner layer is removed everywhere that the second metallization plane is removed, in order to prevent capacitive coupling between said first and second interconnects.

2. The method as claimed in claim 1, wherein patterning and interrupting are carried out in a common etching step.

3. The method as claimed in claim 1, further comprising providing an electrical circuit integrated into a silicon substrate.

4. The method as claimed in claim 3, wherein providing a liner layer comprises fabricating said liner layer from a material selected from the group consisting of silicon dioxide and silicon nitride.

5. The method as claimed in claim 4, wherein said patterning is carried out in a first metal etching step and said interrupting is carried out in a second silicon dioxide etching step.

6. The method as claimed in claim 1, further comprising providing a dielectric in said interspace.

7. The method as claimed in claim 1, further comprising providing a mask on said second metallization plane for use in patterning and interrupting.

* * * * *